United States Patent
Ryu et al.

(10) Patent No.: US 7,391,057 B2
(45) Date of Patent: Jun. 24, 2008

(54) HIGH VOLTAGE SILICON CARBIDE DEVICES HAVING BI-DIRECTIONAL BLOCKING CAPABILITIES

(75) Inventors: Sei-Hyung Ryu, Cary, NC (US); Jason R. Jenny, Wake Forest, NC (US); Mrinal K. Das, Durham, NC (US); Hudson McDonald Hobgood, Pittsboro, NC (US); Anant K. Agarwal, Chapel Hill, NC (US); John W. Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 472 days.

(21) Appl. No.: 11/131,509

(22) Filed: May 18, 2005

(65) Prior Publication Data

US 2006/0261345 A1 Nov. 23, 2006

(51) Int. Cl.
*H01L 31/0312* (2006.01)

(52) U.S. Cl. .................. 257/77; 257/107; 257/147; 257/E27.079

(58) Field of Classification Search .................. 257/77, 257/107, 147–148, 150–153, 155
See application file for complete search history.

(56) References Cited

U.S. PATENT DOCUMENTS

| | | | |
|---|---|---|---|
| 3,629,011 A | 12/1971 | Tohi et al. |
| 4,466,172 A | 8/1984 | Batra |
| 4,779,126 A | 10/1988 | Herman |
| 4,811,065 A | 3/1989 | Cogan |
| 5,111,253 A | 5/1992 | Korman et al. |
| 5,170,231 A | 12/1992 | Fujii et al. |
| 5,184,199 A | 2/1993 | Fujii et al. |
| 5,270,554 A | 12/1993 | Palmour |
| 5,348,895 A | 9/1994 | Smayling et al. |
| 5,384,270 A | 1/1995 | Ueno |
| 5,385,855 A | 1/1995 | Brown et al. |
| 5,393,999 A | 2/1995 | Malhi |
| 5,396,085 A | 3/1995 | Baliga |
| 5,506,421 A | 4/1996 | Palmour |

(Continued)

OTHER PUBLICATIONS

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

(Continued)

*Primary Examiner*—Hoai V Pham
(74) *Attorney, Agent, or Firm*—Myers Bigel Sibley & Sajovec PA

(57) ABSTRACT

High voltage silicon carbide (SiC) devices, for example, thyristors, are provided. A first SiC layer having a first conductivity type is provided on a first surface of a voltage blocking SiC substrate having a second conductivity type. A first region of SiC is provided on the first SiC layer and has the second conductivity type. A second region of SiC is provided in the first SiC layer. The second region of SiC has the first conductivity type and is adjacent to the first region of SiC. A second SiC layer having the first conductivity type is provided on a second surface, opposite the first surface, of the voltage blocking SiC substrate. First, second and third contacts are provided on the first region of SiC, the second region of SiC and the second SiC layer, respectively. Related methods of fabricating high voltage SiC devices are also provided.

18 Claims, 4 Drawing Sheets

U.S. PATENT DOCUMENTS

| | | | |
|---|---|---|---|
| 5,510,281 | A | 4/1996 | Ghezzo et al. |
| 5,510,630 | A | 4/1996 | Agarwal |
| 5,539,217 | A | 7/1996 | Edmond et al. |
| 5,629,531 | A | 5/1997 | Palmour |
| 5,663,580 | A | 9/1997 | Harris et al. |
| 5,710,059 | A | 1/1998 | Rottner |
| 5,726,463 | A | 3/1998 | Brown et al. |
| 5,734,180 | A | 3/1998 | Malhi |
| 5,763,905 | A | 6/1998 | Harris |
| 5,804,483 | A | 9/1998 | Harris |
| 5,814,859 | A | 9/1998 | Ghezzo et al. |
| 5,837,572 | A | 11/1998 | Gardner et al. |
| 5,851,908 | A | 12/1998 | Harris et al. |
| 5,877,041 | A | 3/1999 | Fuller |
| 5,917,203 | A | 6/1999 | Bhatnagar et al. |
| 5,972,801 | A | 10/1999 | Lipkin et al. |
| 5,976,936 | A | 11/1999 | Miyajima et al. |
| 6,020,600 | A | 2/2000 | Miyajima et al. |
| 6,025,233 | A | 2/2000 | Teresawa |
| 6,025,608 | A | 2/2000 | Harris et al. |
| 6,054,352 | A | 4/2000 | Ueno |
| 6,096,607 | A | 8/2000 | Ueno |
| 6,100,169 | A | 8/2000 | Suvorov et al. |
| 6,107,142 | A | 8/2000 | Suvorov et al. |
| 6,117,735 | A | 9/2000 | Ueno |
| 6,133,587 | A | 10/2000 | Takeuchi et al. |
| 6,162,665 | A | 12/2000 | Zommer |
| 6,165,822 | A | 12/2000 | Okuno et al. |
| 6,180,958 | B1 | 1/2001 | Cooper, Jr. |
| 6,204,135 | B1 | 3/2001 | Peters et al. |
| 6,221,700 | B1 | 4/2001 | Okuno et al. |
| 6,228,720 | B1 | 5/2001 | Kitabatake et al. |
| 6,238,967 | B1 | 5/2001 | Shiho et al. |
| 6,239,463 | B1 | 5/2001 | Williams et al. |
| 6,246,076 | B1 | 6/2001 | Lipkin et al. |
| 6,297,100 | B1 | 10/2001 | Kumar et al. |
| 6,303,508 | B1 | 10/2001 | Alok |
| 6,316,791 | B1 | 11/2001 | Schorner et al. |
| 6,344,663 | B1 | 2/2002 | Slater, Jr. et al. |
| 6,399,996 | B1 | 6/2002 | Chang et al. |
| 6,420,225 | B1 | 7/2002 | Chang et al. |
| 6,429,041 | B1 | 8/2002 | Ryu et al. |
| 6,448,160 | B1 | 9/2002 | Chang et al. |
| 6,455,892 | B1 | 9/2002 | Okuno |
| 6,551,865 | B2 | 4/2003 | Kumar et al. |
| 6,573,534 | B1 | 6/2003 | Kumar et al. |
| 6,593,620 | B1 | 7/2003 | Hshieh et al. |
| 6,610,366 | B2 | 8/2003 | Lipkin |
| 6,653,659 | B2 | 11/2003 | Ryu et al. |
| 6,759,684 | B2 | 7/2004 | Fukuda et al. |
| 6,767,843 | B2 | 7/2004 | Lipkin et al. |
| 6,770,911 | B2 | 8/2004 | Agarwal et al. |
| 7,135,359 | B2 * | 11/2006 | Agarwal et al. ............ 438/133 |
| 2002/0038891 | A1 | 4/2002 | Ryu et al. |
| 2002/0047125 | A1 | 4/2002 | Fukuda et al. |
| 2002/0102358 | A1 | 8/2002 | Das et al. |
| 2003/0079676 | A1 | 5/2003 | Ellison et al. |
| 2004/0119076 | A1 | 6/2004 | Ryu |
| 2004/0183092 | A1 | 9/2004 | Yamaguchi et al. |
| 2004/0211980 | A1 | 10/2004 | Ryu |
| 2004/0212011 | A1 | 10/2004 | Ryu |
| 2004/0222501 | A1 | 11/2004 | Kordina |
| 2005/0000406 | A1 | 1/2005 | Janzen et al. |

OTHER PUBLICATIONS

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

D. Alok, E. Arnold, and R. Egloff, "Process Dependence of Inversion Layer Mobility in 4H-SiC Devices," *Materials Science Forum*, vols. 338-342, pp. 1077-1080, 2000.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSFETs Following High Temperature Anneals in Nitric Oxide," *IEEE Electron Device Letters*, vol. 22, No. 4, Apr. 2001.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

L.A. Lipkin and J.W. Palmour, "Low interface state density oxides on p-type SiC," Materials Science Forum vols. 264-268, pp. 853-856, 1998.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

Palmour et al. "SiC Device Technology: Remaining Issues," Diamond and Related Materials. vol. 6, 1997, pp. 1400-1404.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schorner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Ryu et al. Article and Presentation: "27 m$\Omega$-cm$^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Sze, *Physics of Semiconductor Devices, Second Edition*, John Wiley & Sons, 1981, pp. 196-198 and 229-234.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

Williams et al. "Passivation of the 4H-SiC/SiO$_2$ Interface with Nitric Oxide," *Materials Science Forum*. vols. 389-393 (2002), pp. 967-972.

U.S. Appl. No. 60/435,212, "Vertical JFET Limited Silicon Carbide Power Metal-Oxide Semiconductor Field Effect Transistors and Methods of Fabricating Vertical JFET Limited Silicon Carbide Power Metal-Oxide Semiconductor Field Effect Transistors," filed Dec. 20, 2002.

U.S. Appl. No. 60/294,307, "Method of N$_2$O Growth on an Oxide Layer on a Silicon Carbide Layer," filed May 31, 2001.

U.S. Appl. No. 10/686,795, "Methods of Forming Power Semiconductor Devices Using Boule-Grown Silicon Carbide Drift Layers and Power Semiconductor Devices Formed Thereby," filed Oct. 16, 2003.

U.S. Appl. No. 11/052,679, "Process for Producing Silicon Carbide Crystals Having Increased Minority Carrier Lifetimes," filed Feb. 7, 2005.

Ishidoh et al., "A New High Power Symmetrical GTO" *Conference Record of the 1989 IEEE Industry Applications Society Annual Meeting*, Oct. 1-5, 1989, vol. 2, pp. 1273-1278.

International Search Report and Written Opinion of the International Searching Authority for International application No. PCT/US2006/009256, mailed Jul. 24, 2006.

* cited by examiner

HIGH VOLTAGE SILICON CARBIDE DEVICES HAVING BI-DIRECTIONAL BLOCKING CAPABILITIES

FIELD OF THE INVENTION

This invention relates to power semiconductor devices and related methods of fabricating power semiconductor devices and, more particularly, to high voltage silicon carbide devices and related methods of fabricating high voltage silicon carbide devices.

BACKGROUND OF THE INVENTION

Power devices are widely used to carry large currents and support high voltages. Modern power devices are generally fabricated from monocrystalline silicon semiconductor material. One type of power device is the thyristor. A thyristor is a bistable power semiconductor device that can be switched from an off-state to an on-state, or vice versa. Power semiconductor devices, such as thyristors, high-power bipolar junction transistors ("HPBJT"), or power metal oxide semiconductor field effect transistors ("MOSFET"), are semiconductor devices capable of controlling or passing large amounts of current and blocking high voltages.

Thyristors are generally known and conventionally have three terminals: an anode, a cathode, and a gate. A thyristor is turned on by applying a short current pulse across the gate and the cathode. Once the thyristor turns on, the gate may lose its control to turn off the device. The turn off may be achieved by applying a reverse voltage across the anode and the cathode. A specially designed gate turn-off thyristor ("GTO"), however, is typically turned off by a reverse gate pulse. The GTO thyristors generally start conduction by some trigger input and then behave as diodes thereafter.

A thyristor is a highly rugged device in terms of transient currents, di/dt and dv/dt capability. The forward voltage ($V_F$) drop in conventional silicon thyristors is about 1.5 V to 2 V, and for some higher power devices, about 3 V. Therefore, the thyristor can control or pass large amounts of current and effectively block high voltages (i.e., a voltage switch). Although VF determines the on-state power loss of the device at any given current, the switching power loss may become a dominating factor affecting the device junction temperature at high operating frequencies. Because of this, the switching frequencies possible using conventional thyristors may be limited in comparison with many other power devices.

Two parameters of a thyristor are the built-in potential (which is a characteristic of any given semiconductor material's bandgap) and the specific on-resistance (i.e., the resistance of the device in the linear region when the device is turned on). The specific on-resistance for a thyristor is typically as small as possible so as to provide a large current per unit area for a given voltage applied to the thyristor. The lower the specific on-resistance, the lower the $V_F$ drop is for a given current rating. The minimum $V_F$ for a given semiconductor material is its built-in potential (voltage).

Some conventional thyristors may be manufactured in silicon (Si) or gallium arsenide (GaAs), such as a silicon controlled rectifier ("SCR"). Thyristors formed in Si or GaAs, however, may have certain performance limitations resulting from the Si or GaAs material itself, such as the minority carrier lifetime and the thickness of the drift region. The largest contributory factor to specific on-resistance is the resistance of the thick low-doped drift region of the thyristor. In a majority carrier device, such as a MOSFET, the specific on-resistance is determined by the doping concentration and the thickness of the lightly doped drift layer. In a minority carrier (or bipolar) device, carriers, both electrons and holes, are injected into this drift layer, and substantially reduces the specific on-resistance. This effect is referred to as conductivity modulation. As the rated voltage of a thyristor increases, typically the thickness of the drift region increases and the doping of the drift region decreases. For effective conductivity modulation, a very long minority carrier lifetime is typically required. At the same time, the amount of carriers stored in the drift layer typically increases because the volume of the drift layer is increased. Therefore, the time required to remove access carriers in the drift layer, which determines the switching times and frequencies, may increase dramatically for devices with higher blocking voltage ratings.

Development efforts in power devices have includes the use of silicon carbide (SiC) devices for power devices. Silicon carbide has a wide bandgap, a lower dielectric constant, a high breakdown field strength, a high thermal conductivity, and a high saturation electron drift velocity relative to silicon. These characteristics may allow silicon carbide power devices to operate at higher temperatures, higher power levels and with lower specific on-resistance and higher switching frequency than conventional silicon-based power devices. A theoretical analysis of the superiority of silicon carbide devices over silicon devices is found in a publication by Bhatnagar et al. entitled "*Comparison of 6H-SiC, 3C-SiC and Si for Power Devices*", IEEE Transactions on Electron Devices, Vol. 40, 1993, pp. 645-655, the disclosure of which is hereby incorporated herein by reference as if set forth in its entirety. A thyristor fabricated in silicon carbide is described in commonly assigned U.S. Pat. No. 5,539,217 to Edmond et al. entitled Silicon Carbide Thyristor, the disclosure of which is hereby incorporated herein by reference as if set forth in its entirety.

Notwithstanding the potential advantages of silicon carbide, it may be difficult to fabricate power devices, including thyristors, in silicon carbide. For example, these high voltage devices are typically formed using a lightly doped epitaxial layer on a highly doped n-type conductivity silicon carbide substrate having a thickness of from about 300 to about 400 µm. Low resistivity p-type silicon carbide substrates may not be available as a result of the available acceptor species (Aluminum and Boron) having deep energy levels that may result in carrier freeze out. Thus, the exclusive use of n-type substrates may limit the polarity of available high voltage devices. For example, only p-channel Insulated Gate Bipolar Transistors (IGBTs) and pnpn thyristors may be available. In addition, the available devices may only be capable of blocking voltages in one direction.

Furthermore, in order to form a blocking junction at the substrate-epitaxial layer interface, a planar edge termination structure may be formed or an edge beveling process may be used to reduce the likelihood of premature breakdown at the edges of the device. Forming planar edge termination structures on a backside of the device may be difficult and costly to implement as extensive processing may be needed after removal of the 300 to 400 µm thick n-type substrate. Edge beveling may include etching through the substrate or grinding/polishing the sidewalls of the device, which may also be difficult because the voltage blocking epitaxial layers are generally much thinner than the substrate.

SUMMARY OF THE INVENTION

Some embodiments of the present invention provide high voltage silicon carbide (SiC) devices. A first SiC layer having a first conductivity type is provided on a first surface of a voltage blocking SiC substrate having a second conductivity type. A first region of SiC is provided on the first SiC layer and has the second conductivity type. A second region of SiC is provided in the first SiC layer. The second region of SiC has the first conductivity type and is adjacent to the first region of SiC. A second SiC layer having the first conductivity type is provided on a second surface, opposite the first surface, of the voltage blocking SiC substrate. First, and second contacts are provided on the first region of SiC and the second SiC layer, respectively.

In further embodiments of the present invention, the voltage blocking substrate may include a 4H—SiC high purity substrate having a carrier concentration no greater than about $1.0 \times 10^{15}$ cm$^{-3}$. The voltage blocking substrate may have a thickness of greater than about 100 µm. The first conductivity type may be p-type SiC and the second conductivity type may be n-type SiC. Alternatively, the first conductivity type may be n-type SiC and the second conductivity type may be p-type SiC.

In still further embodiments of the present invention, the first SiC layer may have a carrier concentration of from about $1.0 \times 10^{15}$ cm$^{-3}$ to about $1.0 \times 10^{19}$ cm$^{-3}$. The second SiC layer may have a carrier concentration of from about $1.0 \times 10^{16}$ cm$^{-3}$ to about $1.0 \times 10^{21}$ cm$^{-3}$. The first region of SiC may have a carrier concentration of from about $1.0 \times 10^{17}$ cm$^{-3}$ to about $1.0 \times 10^{21}$ cm$^{-3}$.

In some embodiments of the present invention, the first SiC layer may have a thickness of from about 0.1 µm to about 20.0 µm. The second SiC layer may have a thickness of from about 0.5 µm to about 50.0 µm. The first region of SiC may have a thickness of from about 0.1 µm to about 10.0 µm.

In further embodiments of the present invention, the SiC device may be a thyristor. The first region of SiC may be an anode region of the thyristor, the second region of SiC may be a gate region of the thyristor and the second SiC layer may be a cathode region of the thyristor. A third contact may be provided on the second region of SiC. The first, second and third contacts may be an anode contact, a cathode contact and a gate contact, respectively. The device may further include first, second and third overlayers on the first, second and third contacts, respectively.

In still further embodiments of the present invention, the second region of SiC may have a carrier concentration of from about $1.0 \times 10^{17}$ cm$^{-3}$ to about $1.0 \times 10^{21}$ cm$^{-3}$ and may extend into the first SiC layer from about 0.1 µm to about 2.0 µm. The voltage blocking substrate may be a bidirectional voltage blocking layer and have a edge termination structure. In certain embodiments of the present invention, the voltage blocking substrate may be a boule grown substrate. The edge termination structure may provide a first blocking junction between the first surface of the voltage blocking substrate and the first SiC layer and a second blocking junction between the second surface of the voltage blocking substrate and the second SiC layer.

Some embodiments of the present invention provide a silicon carbide (SiC) thyristor. A first SiC layer having a first conductivity type is provided on a first surface of a voltage blocking SiC substrate having a second conductivity type. A SiC anode region is provided on the first SiC layer and has the second conductivity type. A SiC gate region is provided in the first SiC layer. The SiC gate region has the first conductivity type and is adjacent to the SiC anode region. A SiC cathode layer having the first conductivity type is provided on a second surface, opposite the first surface, of the voltage blocking SiC substrate. An anode contact, a gate contact and a cathode contact are provided on the SiC anode region, the SiC gate region and the SiC cathode layer, respectively.

While the present invention is described above primarily with reference to high voltage devices and thyristors, methods of fabricating high voltage devices and thyristors are also provided herein.

DETAILED DESCRIPTION OF EMBODIMENTS OF THE INVENTION

Figure 1:
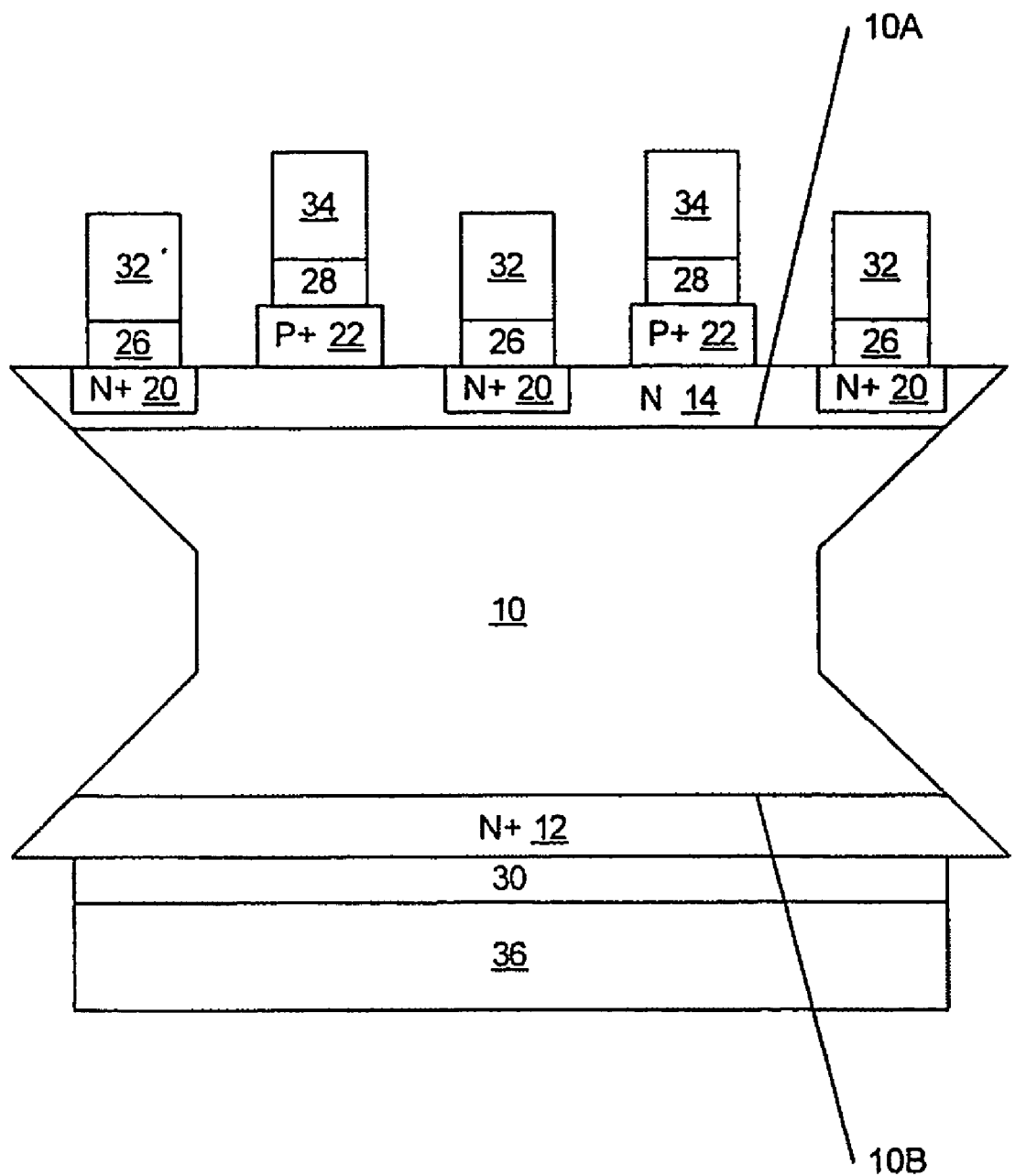
FIG. 1 is a cross section illustrating high voltage silicon carbide devices, for example, thyristors according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the Figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Embodiments of the present invention are described with reference to a particular polarity conductivity type for various layers/regions. However, as will be appreciated by those of skill in the art, the polarity of the regions/layers may be inverted to provide an opposite polarity device. For example, the terms "first conductivity type" and "second conductivity type" refer to opposite conductivity types such as n or p-type, however, each embodiment described and illustrated herein includes its complementary embodiment as well.

Some embodiments of the present invention prevention provide thyristors and/or other power devices that may include silicon carbide voltage blocking substrates as discussed herein. Thus, while embodiments of the present invention are described with reference to thyristors, embodiments of the present invention may be used in other devices, such as metal oxide semiconductor field effect transistors (MOSFETs), Insulated Gate Bipolar Transistors (IGBTs) or other such high voltage power devices.

According to some embodiments of the present invention, high voltage power devices are provided on voltage blocking substrates. Thus, voltage blocking and carrier injecting pn junctions can be provided by forming silicon carbide layers on first and second opposite surfaces of the voltage blocking substrate, i.e. the voltage blocking substrate may allow the provision of high voltage devices having bi-directional blocking capabilities. Furthermore, according to some embodiments of the present invention discussed herein removal of from about 300 to about 400 μm of the substrate may no longer be necessary to provide a termination structure, therefore, allowing for voltage blocking in multiple directions. An edge beveling process may also be simplified according to some embodiments of the present invention as the location of the pn blocking junctions (i.e., between the voltage blocking substrate and the layer formed thereon) may be well defined and the voltage blocking layer (substrate) accounts for most of the thickness of the device. Thus, according to some embodiments of the present invention, high voltage devices may be provided on n-type and/or p-type silicon carbide substrates, which may increase the polarities available in high voltage devices as discussed further herein.

As used herein, a "voltage blocking substrate" refers to an n-type or a p-type high purity silicon carbide substrate capable of providing a bi-directional voltage blocking layer for a high voltage device. In some embodiments of the present invention, the voltage blocking substrate may be a 4H—SiC substrate having a carrier concentration of no greater than about $1.0\times10^{15}$ cm$^{-3}$ and a thickness of greater than about 100 μm. The details with respect to the voltage blocking substrate and methods of fabricating the voltage blocking substrate are discussed in commonly assigned U.S. patent application Ser. No. 11/052,679 entitled Process for Producing Silicon Carbide Crystals Having Increased Minority Carrier Lifetimes, filed Feb. 7, 2005, the disclosure of which is incorporated herein by reference as if set forth herein in its entirety.

Referring now to FIG. 1, high voltage silicon carbide devices according to some embodiments of the present invention will be discussed. As illustrated in FIG. 1, a silicon carbide (SiC) voltage blocking substrate 10 may be provided. As discussed above, the polarity of the substrate 10 may be n-type or p-type SiC having a polytype of 3C, 2H, 4H, 6H or 15R. For exemplary purposes only, devices discussed according to embodiments of the present invention illustrated in FIG. 1 include p-type SiC substrates 10 and, thus, a pnpn device will be discussed herein. In some embodiments of the present invention, the substrate 10 may be a high purity 4H SiC substrate having a carrier concentration of no greater than about $1.0\times10^{15}$ cm$^{-3}$ and a thickness of greater than about 100 μm.

In some embodiments of the present invention, the substrate 10 may be a boule grown substrate. Boule grown substrates are discussed in commonly assigned U.S. patent application Ser. No. 10/686,795, filed Oct. 16, 2003, entitled Methods of Forming Power Semiconductor Devices using Boule-Grown Silicon Carbide Drift Layers and Power Semiconductor Devices Formed Thereby, the disclosure of which is hereby incorporated herein by reference as if set forth in its entirety.

As further illustrated in FIG. 1, a first layer of SiC 14 may be provided on a first surface 10A of the substrate 10. The first layer of SiC 14 may be a p-type or an n-type SiC epitaxial layer or implanted layer. As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region or layer" and "implanted region or layer" structurally distinguish differing regions of silicon carbide.

According to embodiments of the present invention illustrated in FIG. 1, the first layer of SiC 14 may be an n-type epitaxial layer provided on a p-type substrate 10. The n-type SiC epitaxial layer 14 may have a carrier concentration of from about $1.0\times10^{15}$ to about $1.0\times10^{19}$ cm$^{-3}$ and a thickness of from about 0.1 to about 20.0 μm.

A second layer of SiC 12 may be provided on a second surface 10B of the substrate 10. The second layer of SiC 12 may be a p-type or an n-type SiC epitaxial layer or implanted layer. According to embodiments of the present invention illustrated in FIG. 1, the second layer of SiC 12 may be an n$^+$ epitaxial layer provided on the second surface 10B of the p-type substrate 10. As used herein, "p$^+$" or "n$^+$" refer to regions that are defined by higher carrier concentrations than are present in adjacent or other regions of the same or another layer or substrate. Similarly, "p$^-$" or "n$^-$" refer to regions that are defined by lower carrier concentrations than are present in adjacent or other regions of the same or another layer or substrate. The n$^+$ epitaxial layer 12 may provide a cathode region of a thyristor according to some embodiments of the present invention. The n$^+$ epitaxial layer 12 may have a carrier concentration of from about $1.0\times10^{16}$ to about $1.0\times10^{21}$ cm$^{-3}$ and a thickness of from about 0.5 to about 50.0 μm.

First regions of SiC 22 may be provided on the first layer of SiC 14. In embodiments of the present invention illustrated in FIG. 1, the first regions of SiC 22 may be p$^+$ regions of SiC and may provide anode fingers/anode regions of a thyristor according to some embodiments of the present invention. The p$^+$ regions of SiC 22 may have carrier concentrations of from about $1.0 \times 10^{17}$ to about $1.0 \times 10^{21}$ cm$^{-3}$ and thicknesses of from about 0.1 to about 10.0 μm.

Second regions of SiC 20 may be provided in the first layer of SiC 14. In embodiments of the present invention illustrated in FIG. 1, the second regions of SiC 20 may be n$^+$ regions of SiC and may provide gate regions of a thyristor according to some embodiments of the present invention. The n$^+$ regions of SiC 20 may have carrier concentrations of from about $1.0 \times 10^{17}$ to about $1.0 \times 10^{21}$ cm$^{-3}$ and may extend into the first layer of SiC 14 from about 0.1 to about 2.0 μm.

Ohmic contacts 26, 28 and 30 are provided on the second regions of SiC 20, the first regions of SiC 22 and the second layer of SiC 12, respectively. As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents. The ohmic contacts 26, 28 and 30 may provide a gate contact, an anode contact and a cathode contact, respectively, for a thyristor according to some embodiments of the present invention. In some embodiments of the present invention, ohmic contacts provided on n$^+$ regions, such as the second regions of SiC 20 and the second layer of SiC 12, may include, for example, nickel (Ni) contacts. Furthermore, ohmic contacts provided on p$^+$ regions, for example, the first regions of SiC 22, may include, for example, aluminum (Al) based contacts, such Al/(Titanium (Ti)) contacts. It will be understood that these metals are provided for exemplary purposes only and that other suitable metals may also be used without departing from the scope of the present invention. Metal overlayers 32, 34 and 36 may be provided on the ohmic contacts 26, 28 and 30, respectively. These metal overlayers may include, for example, gold, silver, aluminum, platinum and/or copper. Other suitable highly conductive metals may also be used for the overlayers. The overlayers 32, 34 and 36 may have thicknesses of from about 0.5 μm to about 20 μm. The presence of the overalayers 32, 34 and 36 may provide a more suitable device for soldering and/or wire bonding as will be understood by those having skill in the art.

As further illustrated in FIG. 1, the edges of the device may be beveled according to some embodiments of the present invention. The edge beveling process may be performed to provide an edge termination structure. According to some embodiments of the present invention, a pn blocking junction may be provided between the first surface 10A of the substrate 10 and the first layer of SiC 14 and the second surface 10B of the substrate 10 and the second layer of SiC 12. Edge beveling is discussed in detail in Physics of Semiconductor Devices by S. M. Sze at pages 196-198, the content of which is incorporated herein by reference as if set forth in its entirety.

It will be understood that although embodiments of the present invention discussed with respect to FIG. 1 include a pnpn thyristor, embodiments of the present invention are not limited to this configuration. For example, devices having opposite conductivity types may also be provided. In particular, a device may be provided having an n-type SiC substrate 10, a p-type first layer of SiC 14 on the first surface 10A of the substrate 10, a p$^+$ layer of SiC 12 on the second surface 10B of the substrate 10, n$^+$ first regions of SiC 22 and p$^+$ second regions of SiC 20 without departing from the scope of the present invention.

As discussed above, with respect to FIG. 1, devices according to some embodiments of the present invention may be provided on voltage blocking substrates capable of providing a bi-directional voltage blocking layer. Providing devices on voltage blocking substrates may allow the provision of high voltage power devices having p-type and n-type conductivity substrates, which may increase the available polarity of such devices. Furthermore, pn junctions between surfaces of the substrate and layers provided thereon may be more easily identifiable, which may allow provision of devices capable of blocking in multiple directions as discussed herein.

Figure 2A:
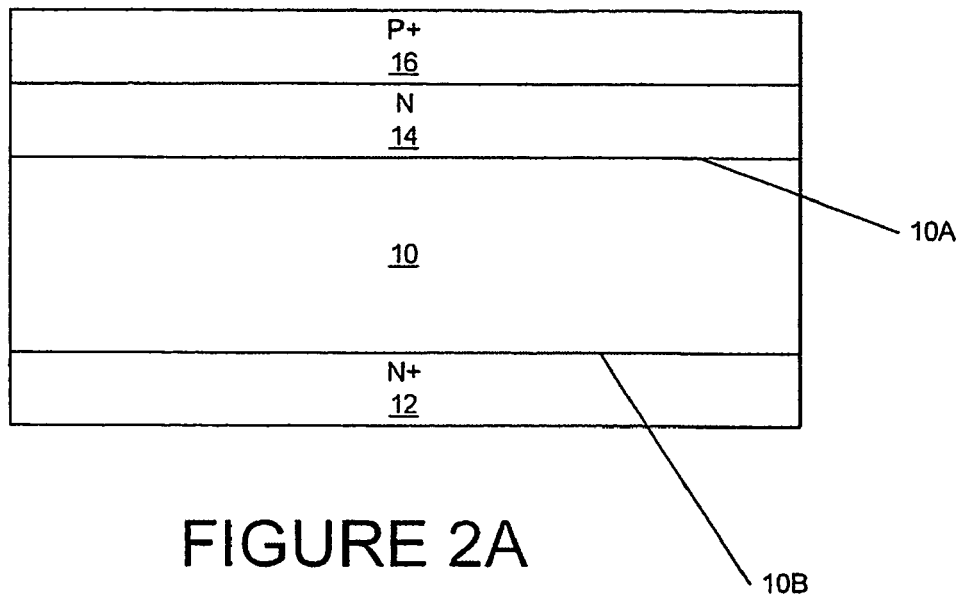
FIGS. 2A through 2F are cross sections illustrating processing steps in the fabrication of high voltage silicon carbide devices, for example, thyristors, of FIG. 1 according to some embodiments of the present invention.

Referring now to FIGS. 2A through 2F, processing steps in the fabrication of power devices, for example, thyristors, on voltage blocking substrates according to some embodiments of the present invention will be discussed. As illustrated in FIG. 2A, a first layer of SiC 14 is formed on a first surface 10A of a silicon carbide (SiC) voltage blocking substrate 10. The SiC substrate 10 may be n-type or p-type silicon carbide. For exemplary purposes only, the SiC substrate 10 of FIGS. 2A through 2F is a p-type SiC substrate. In some embodiments of the present invention, the substrate 10 may be a high purity 4H SiC substrate having a carrier concentration of no greater than about $1.0 \times 10^{15}$ cm$^{-3}$ and a thickness of greater than about 100 μm. In some embodiments of the present invention, the voltage blocking substrate may be fabricated using methods discussed in commonly assigned U.S. patent application Ser. No. 11/052,679 entitled Process for Producing Silicon Carbide Crystals Having Increased Minority Carrier Lifetimes, filed Feb. 7, 2005, the disclosure of which has been incorporated herein by reference.

The first layer of SiC 14 may be a p-type or an n-type silicon carbide layer and may grown on the first surface 10A of the substrate 10 or implanted in the first surface of 10A the substrate 10 without departing from the scope of the present invention. If the first layer of SiC 14 is an n-type implanted region, for example, nitrogen or phosphorus ions may be implanted. If, on the other hand the first layer of SiC is a p-type implanted region, for example, Al or Boron(B) ions may be implanted. In embodiments of the present invention discussed with respect to FIGS. 2A through 2F, the first layer of SiC 14 may be an n-type epitaxial layer formed on a first surface 10A of a p-type substrate 10. The n-type SiC epitaxial layer 14 may have a carrier concentration of from about $1.0 \times 10^{15}$ to about $1.0 \times 10^{19}$ cm$^{-3}$ and a thickness of from about 0.1 to about 20.0 μm.

A second layer of SiC 12 may be formed on a second surface 10B of the substrate 10. The second layer of SiC 12 may be p-type or n-type SiC and may be grown on the second surface 10B of the substrate or implanted in the second surface 10B of the substrate 10. According to embodiments of the present invention illustrated in FIGS. 2A through 2F, the second layer of SiC 12 may be an n$^+$ epitaxial layer provided on the second surface 10B of the p-type substrate 10. The n$^+$ epitaxial layer 12 may provide a cathode region of a thyristor according to some embodiments of the present invention. The n$^+$ epitaxial layer 12 may have a carrier concentration of from about $1.0 \times 10^{16}$ to about $1.0 \times 10^{21}$ cm$^{-3}$ and a thickness of from about 0.5 to about 50.0 μm.

A third layer of SiC 16 may be formed on the first layer of SiC 14. The third layer of SiC 16 may be p-type or n-type SiC and may be grown on a surface of the first layer of SiC 14 or implanted in the surface of the first layer of SiC 14. According to embodiments of the present invention illustrated in FIGS. 2A through 2F, the third layer of SiC 16 may be an p$^+$ epitaxial layer provided on the surface of the first layer of SiC 16. The third layer of SiC 16 may have a carrier concentration of from about $1.0 \times 10^{17}$ to about $1.0 \times 10^{21}$ cm$^{-3}$ and a thickness of from about 0.1 to about 10.0 µm.

Figure 2B:
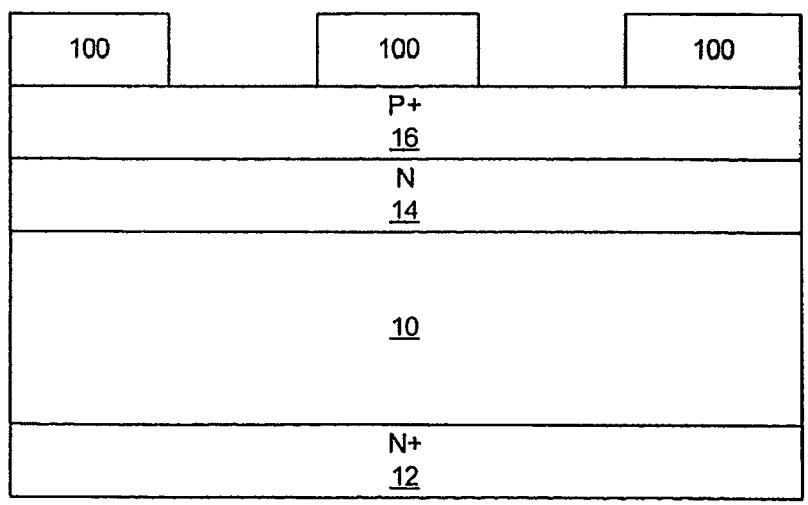
Figure 2C:
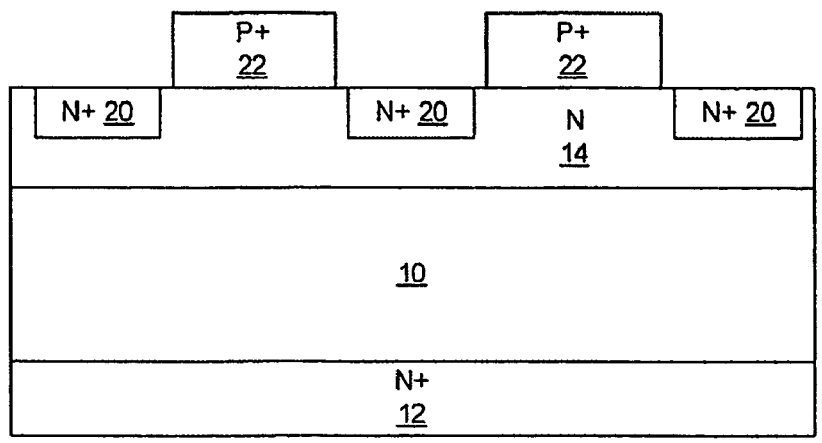

Referring now to FIGS. 2B and 2C, the first regions of SiC 22 may be formed by patterning the third layer of SiC 16 according to a mask layer 100 having openings corresponding to the location of the first regions of SiC 22. Thus, the first regions of SiC 22 are provided on the first layer of SiC 14. As discussed above, the first regions of SiC 22 may provide anode fingers/anode regions of a thyristor according to some embodiments of the present invention.

As further illustrated in FIG. 2C, second regions of SiC 20 may be implanted in the first layer of SiC 14. An ion implantation mask (not shown) may be provided to focus the implant on the second regions of SiC 20. In embodiments of the present invention illustrated in FIG. 2C, the second regions of SiC 20 may be n$^+$ regions of SiC and, therefore, the implanted ions may be, for example, nitrogen or phosphorus ions. The second regions of SiC 20 may provide gate regions of a thyristor according to some embodiments of the present invention. The n$^+$ regions of SiC 20 may have carrier concentrations of from about $1.0 \times 10^{17}$ to about $1.0 \times 10^{21}$ cm$^{-3}$ and the implanted regions may extend into the first layer of SiC 14 from about 0.1 to about 2.0 µm.

Figure 2D:
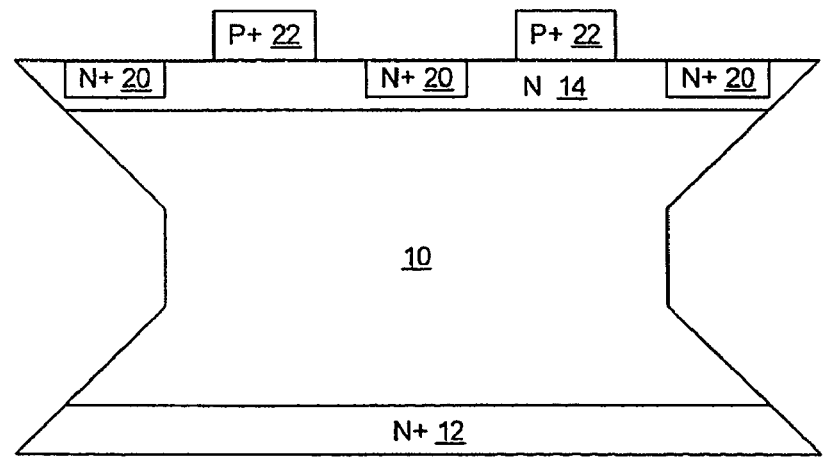

As illustrated in FIG. 2D, the edges of the device may be beveled according to some embodiments of the present invention. Beveling may be performed by, for example, plasma etching or mechanical grinding. The edge beveling process may be performed to provide an edge termination structure. According to some embodiments of the present invention, a pn blocking junction may be provided between the first surface 10A of the substrate 10 and the first layer of SiC 14 and the second surface 10B of the substrate 10 and the second layer of SiC 12. Edge beveling is discussed in detail in *Physics of Semiconductor Devices* by S. M. Sze at pages 196-198, the content of which has been incorporated herein by reference. A sacrificial oxide layer (not shown) may be formed on the surface of the device and removed to repair any damage to the surface of the device that may have occurred during the edge beveling process.

Figure 2E:
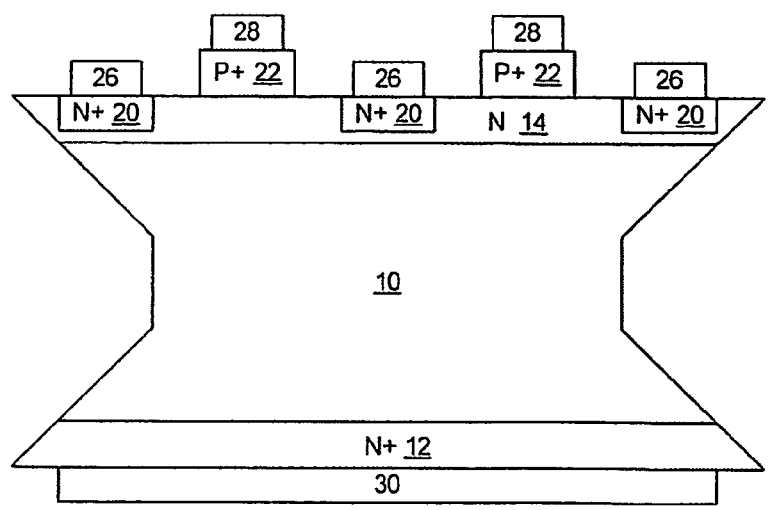

Referring now to FIG. 2E, metal may be deposited on the second regions of SiC 20, the first regions of SiC 22 and the second layer of SiC 12 to provide first, second and third contacts 26, 28 and 30, respectively. It will be understood by those having skill in the art that an oxide layer may be formed on the surface of the device and windows corresponding to the first, second and third contacts 26, 28 and 30 may be opened in the oxide layer. Accordingly, the metal may be deposited in the windows. As discussed above, nickel (Ni) may be deposited for ohmic contacts on n$^+$ regions and Al based metal compounds, such Al/Ti, may be deposited for ohmic contacts on p$^+$ regions. The ohmic contacts 26, 28 and 30 may provide a gate contact, an anode contact and a cathode contact, respectively, for a thyristor according to some embodiments of the present invention. Once the metals are deposited, the deposited metals may be annealed at temperature from about 500 to about 1200° C. in an inert ambient.

Figure 2F:
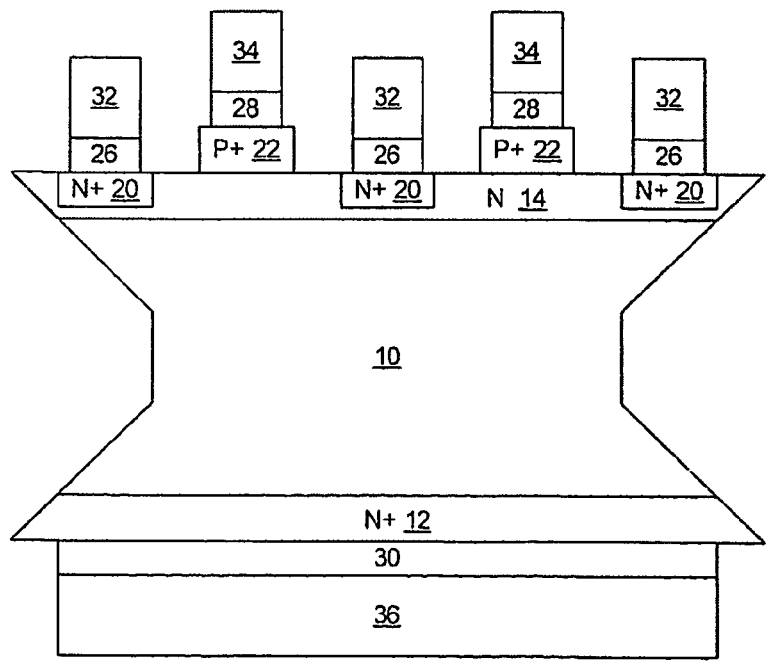

Referring now to FIG. 2F, metal may be deposited on the ohmic contacts 26, 28 and 30 to provide metal overlayers 32, 34 and 36, respectively. These metal overlayers may include, for example, gold, silver, aluminum, platinum and/or copper. Other suitable highly conductive metals may also be used for the overlayers. The overlayers 32, 34 and 36 may have thicknesses of from about 0.5 µm to about 10 µm. The presence of the overlayers 32, 34 and 36 may provide a more suitable device for soldering and/or wire bonding as will be understood by those having skill in the art.

It will be understood by those having skill in the art that although the processing steps in the fabrication of high voltage devices according to embodiments of the present invention are discussed in a particular order herein, the order of steps in FIGS. 2A through 2F may be changed without departing from the scope of the present invention. Accordingly, the present invention should not be construed as limited to the exact sequence of operations described herein but is intended to encompass other sequences of fabrication that will become apparent to those of skill in the art in light of the present disclosure.

It will also be understood that although particular embodiments of high voltage devices, for example, thyristors, are discussed herein, embodiments of the present invention are not limited to this configuration. For example, devices according to some embodiments of the present invention may be light-activated devices. For example, light activated device are discussed in commonly assigned U.S. Pat. No. 6,770,911 entitled Large Area Silicon Carbide Devices and Manufacturing Methods Therefor, the disclosure of which is hereby incorporated herein by reference as if set forth in its entirety.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A high voltage silicon carbide (SiC) device, comprising:
   a first SiC layer having a first conductivity type on a first surface of a voltage blocking SiC substrate having a second conductivity type;
   a first region of SiC on the first SiC layer and having the second conductivity type;
   a second region of SiC in the first SiC layer, having the first conductivity type and being adjacent to the first region of SiC;
   a second SiC layer having the first conductivity type on a second surface, opposite the first surface, of the voltage blocking SiC substrate; and
   first and second contacts on the first region of SiC and the second SiC layer, respectively.

2. The device of claim 1, wherein the voltage blocking substrate comprises a 4H—SiC high purity substrate having a carrier concentration no greater than about $1.0 \times 10^{15}$ cm$^{-3}$.

3. The device of claim 2, wherein the voltage blocking substrate has a thickness of greater than about 100 µm.

4. The device of claim 1, wherein the first conductivity type comprises p-type SiC and the second conductivity type comprises n-type SiC.

5. The device of claim 1, wherein the first conductivity type comprises n-type SiC and the second conductivity type comprises p-type SiC.

6. The device of claim 1:
   wherein the first SiC layer has a carrier concentration of from about $1.0 \times 10^{15}$ cm$^{-3}$ to about $1.0 \times 10^{19}$ cm$^{-3}$; and
   wherein the second SiC layer has a carrier concentration of from about $1.0 \times 10^{17}$ cm$^{-3}$ to about $1.0 \times 10^{21}$ cm$^{-3}$; and
   wherein the first region of SiC has a carrier concentration of from about $1.0 \times 10^{16}$ cm$^{-3}$ to about $1.0 \times 10^{21}$ cm$^{-}$.

7. The device of claim 1:
   wherein the first SiC layer has a thickness of from about 0.1 µm to about 20.0 µm;
   wherein the second SiC layer has thickness of from about 0.5 µm to about 50.0 µm; and wherein the first region of SiC has a thickness of from about 0.1 μm to about 10.0 μm.

8. The device of claim 1, wherein the SiC device comprises a thyristor, wherein the first region of SiC comprises an anode region of the thyristor, wherein the second region of SiC comprises a gate region of the thyristor and wherein the second SiC layer comprises a cathode region of the thyristor.

9. The device of claim 8, further comprising a third contact on the second region of SiC, wherein the first, second and third contacts comprise an anode contact, a cathode contact and a gate contact, respectively, the device further comprising first, second and third overlayers on the first, second and third contacts, respectively.

10. The device of claim 1, wherein the second region of SiC has a carrier concentration of from about $1.0 \times 10^{17}$ cm$^{-3}$ to about $1.0 \times 10^{21}$ cm$^{-3}$ and extends into the first SiC layer from about 0.1 μm to about 2.0 μm.

11. The device of claim 1, wherein the voltage blocking substrate is a bi-directional voltage blocking layer and has an edge termination structure.

12. The device of claim 11, wherein the voltage blocking substrate is a boule grown substrate.

13. The device of claim 1, wherein the edge termination provides:
a first blocking junction between the first surface of the voltage blocking substrate and the first SiC layer; and
a second blocking junction between the second surface of the voltage blocking substrate and the second SiC layer.

14. A silicon carbide (SiC) thyristor, comprising:
a first SiC layer having a first conductivity type on a first surface of a voltage blocking SIC substrate having a second conductivity type;
a SiC anode region on the first SiC layer and having the second conductivity type;
a SiC gate region in the first SiC layer, having the first conductivity type and being adjacent to the SiC anode region;
a SiC cathode layer having the first conductivity type on a second surface, opposite the first surface, of the voltage blocking SiC substrate; and
an anode contact, a gate contact and a cathode contact on the SiC anode region, the SiC gate region and the SiC cathode layer, respectively.

15. The thyristor of claim 14, wherein the voltage blocking substrate is a bi-directional voltage blocking layer and has a edge termination structure.

16. The thyristor of claim 15, wherein the edge termination structure provides:
a first blocking junction between the first surface of the voltage blocking substrate and the first SiC layer; and
a second blocking junction between the second surface of the voltage blocking substrate and the SiC cathode layer.

17. A high voltage silicon carbide (SiC) device, comprising:
a first SiC layer having a first conductivity type on a first surface of a voltage blocking SiC epilayer having a second conductivity type;
a first region of SiC on the first SiC layer and having the second conductivity type;
a second region of SIC in the first SiC layer, having the first conductivity type and being adjacent to the first region of SiC;
a second SiC layer having the first conductivity type on a second surface, opposite the first surface, of the voltage blocking SiC epilayer; and
first and second contacts on the first region of SiC and the second SiC layer, respectively.

18. A silicon carbide (SiC) thyristor, comprising:
a first SiC layer having a first conductivity type on a first surface of a voltage blocking SiC epilayer having a second conductivity type;
a SiC anode region on the first SiC layer and having the second conductivity type;
a SiC gate region in the first SiC layer, having the first conductivity type and being adjacent to the SiC anode region;
a SiC cathode layer having the first conductivity type on a second surface, opposite the first surface, of the voltage blocking SiC epilayer; and
an anode contact, a gate contact and a cathode contact on the SiC anode region, the SiC gate region and the SiC cathode layer, respectively.

* * * * *

UNITED STATES PATENT AND TRADEMARK OFFICE
CERTIFICATE OF CORRECTION

| | | |
|---|---|---|
| PATENT NO. | : 7,391,057 B2 | Page 1 of 1 |
| APPLICATION NO. | : 11/131509 | |
| DATED | : June 24, 2008 | |
| INVENTOR(S) | : Ryu et al. | |

It is certified that error appears in the above-identified patent and that said Letters Patent is hereby corrected as shown below:

Item 56, Other Publications: Please add the following publications considered on April 11, 2008:
 -- Patel, R., et al., Phosphorus-Implanted High-Voltage N.sup.+P 4H-Sic Junction Rectifiers, Proceedings of 1998 International Symposium on Poer Semiconductor Devices & ICs, pp. 387-390 (Koryo) --

-- Y. Wang, C. Weitzel, and M. Bhatnagar, "Accumulation-Mode SiC Power MOSFET Design Issues," *Materials Science Forum*, Vols. 338-342, pp. 1287-1290. --

Column 10, Claim 6, Line 58: Please delete "and" after ";"
 Line 62: Please correct "$cm^-$." to read -- $cm^{-3}$. --

Column 12, Claim 17, Line 17: Please correct "SIC" to read -- SiC --

Signed and Sealed this

Nineteenth Day of August, 2008

JON W. DUDAS
*Director of the United States Patent and Trademark Office*